United States Patent
Chou et al.

(10) Patent No.: US 10,312,238 B2
(45) Date of Patent: Jun. 4, 2019

(54) MANUFACTURING METHOD OF MAGNETIC RANDOM ACCESS MEMORY CELL

(71) Applicant: UNITED MICROELECTRONICS CORP., Hsin-Chu (TW)

(72) Inventors: Hsiao-Pang Chou, Taipei (TW); Yu-Ru Yang, Hsinchu County (TW); Chih-Chien Liu, Taipei (TW); Chao-Ching Hsieh, Tainan (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/803,852

(22) Filed: Nov. 6, 2017

(65) Prior Publication Data

US 2019/0139959 A1 May 9, 2019

(51) Int. Cl.
| | |
|---|---|
| *H01L 43/12* | (2006.01) |
| *H01L 43/02* | (2006.01) |
| *H01L 27/02* | (2006.01) |
| *H01L 27/22* | (2006.01) |
| *H01L 27/105* | (2006.01) |
| *G11C 11/16* | (2006.01) |
| *H01L 23/528* | (2006.01) |

(Continued)

(52) U.S. Cl.
CPC ........ *H01L 27/1052* (2013.01); *G11C 11/161* (2013.01); *H01L 23/528* (2013.01); *H01L 43/02* (2013.01); *H01L 43/08* (2013.01); *H01L 43/10* (2013.01); *H01L 43/12* (2013.01)

(58) Field of Classification Search
CPC ....... H01L 27/222; H01L 41/08; H01L 43/12; H01L 43/02; H01L 27/224; G11C 11/161
See application file for complete search history.

(56) References Cited

U.S. PATENT DOCUMENTS

| | | | |
|---|---|---|---|
| 8,975,089 B1 * | 3/2015 | Jung | ............ H01L 43/12 257/295 |
| 9,362,490 B1 | 6/2016 | Xiao | |

(Continued)

OTHER PUBLICATIONS

Sato, Comprehensive study of CoFeB—MgO magnetic tunnel junction characteristics with single- and double-interface scaling down to 1X nm, Electron Devices Meeting (IEDM), 2013 IEEE International, Dec. 2013.

*Primary Examiner* — Brian Turner
(74) *Attorney, Agent, or Firm* — Winston Hsu (57) ABSTRACT

A manufacturing method of a magnetic random access memory (MRAM) cell includes the following steps. A magnetic tunnel junction (MTJ) film stack is formed on an insulation layer. An aluminum mask layer is formed on the MTJ film stack. A hard mask layer is formed on the aluminum mask layer. An ion beam etching (IBE) process is performed with the aluminum mask layer and the hard mask layer as a mask. The MTJ film stack is patterned to be a patterned MTJ film stack by the IBE process, and at least apart of the aluminum mask layer is bombarded by the IBE process for forming an aluminum film on a sidewall of the patterned MTJ film stack. An oxidation treatment is performed, and the aluminum film is oxidized to be an aluminum oxide protection layer on the sidewall of the patterned MTJ film stack by the oxidation treatment.

10 Claims, 5 Drawing Sheets

(51) Int. Cl.
*H01L 43/10* (2006.01)
*H01L 43/08* (2006.01)

(56) References Cited

U.S. PATENT DOCUMENTS

| | | | |
|---|---|---|---|
| 2014/0167191 A1* | 6/2014 | Doyle | H01L 43/02 |
| | | | 257/421 |
| 2014/0170776 A1* | 6/2014 | Satoh | H01L 43/12 |
| | | | 438/3 |
| 2015/0044781 A1* | 2/2015 | Tokashiki | H01L 43/12 |
| | | | 438/3 |
| 2015/0104882 A1* | 4/2015 | Jung | H01L 43/12 |
| | | | 438/3 |
| 2016/0087195 A1* | 3/2016 | Sonoda | H01L 43/12 |
| | | | 438/3 |
| 2016/0125925 A1* | 5/2016 | Meng | G11C 11/161 |
| | | | 365/158 |
| 2016/0268499 A1* | 9/2016 | You | H01L 43/12 |
| 2017/0148979 A1* | 5/2017 | Kim | H01L 27/228 |
| 2017/0358739 A1* | 12/2017 | Kim | H01L 27/222 |
| 2018/0033957 A1* | 2/2018 | Zhang | H01L 43/12 |

\* cited by examiner

MANUFACTURING METHOD OF MAGNETIC RANDOM ACCESS MEMORY CELL

BACKGROUND OF THE INVENTION

1. Field of the Invention

The present invention relates to a manufacturing method of a magnetic random access memory (MRAM) cell, and more particularly, to a manufacturing method of a MRAM cell including an aluminum oxide protection layer.

2. Description of the Prior Art

There are essentially two types of data memory devices used in electronic products, non-volatile and volatile memory devices. Magnetic random access memory (MRAM) is a kind of non-volatile memory technology. Unlike current industry-standard memory devices, MRAM uses magnetism instead of electrical charges to store data. In general, MRAM cells include a data layer and a reference layer. The data layer is composed of a magnetic material and the magnetization of the data layer can be switched between two opposing states by an applied magnetic field for storing binary information. The reference layer can be composed of a magnetic material in which the magnetization is pinned so that the strength of the magnetic field applied to the data layer and partially penetrating the reference layer is insufficient for switching the magnetization in the reference layer. During the read operation, the resistance of the MRAM cell is different when the magnetization alignments of the data layer and the reference layer are the same or not, and the magnetization polarity of the data layer can be identified accordingly.

Generally, the manufacturing process of the MRAM cell can be integrated with the conventional semiconductor manufacturing processes of integrated circuits. However, the magnetic properties of ferromagnetic layers may be deteriorated by related manufacturing processes and the performance of the MRAM cell may be influenced accordingly.

SUMMARY OF THE INVENTION

A manufacturing method of a magnetic random access memory (MRAM) cell is provided by the present invention. In the manufacturing method, an aluminum film is formed on a sidewall of a patterned magnetic tunnel junction (MTJ) film stack by an ion beam etching process, and the aluminum film is oxidized by an oxidation treatment for forming an aluminum oxide protection layer on the sidewall of the patterned MTJ film stack. The aluminum oxide protection layer may be used to isolate different layers in the patterned MTJ film stack without influencing the magnetic properties of the patterned MTJ film stack.

According to one embodiment of the present invention, a manufacturing method of a MRAM cell is provided. The manufacturing method includes the following steps. A MTJ film stack is formed on an insulation layer. An aluminum mask layer is formed on the MTJ film stack. A hard mask layer is formed on the aluminum mask layer. An IBE process is performed with the aluminum mask layer and the hard mask layer as a mask. The MTJ film stack is patterned to be a patterned MTJ film stack by the IBE process, and at least a part of the aluminum mask layer is bombarded by the IBE process for forming an aluminum film on a sidewall of the patterned MTJ film stack. An oxidation treatment is performed, and the aluminum film is oxidized to be an aluminum oxide protection layer on the sidewall of the patterned MTJ film stack by the oxidation treatment.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 are schematic drawings illustrating a manufacturing method of a magnetic random access memory (MRAM) cell according to a first embodiment of the present invention, wherein

FIGS. 7-9 are schematic drawings illustrating a manufacturing method of a MRAM cell according to a third embodiment of the present invention, wherein

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Figure 1:
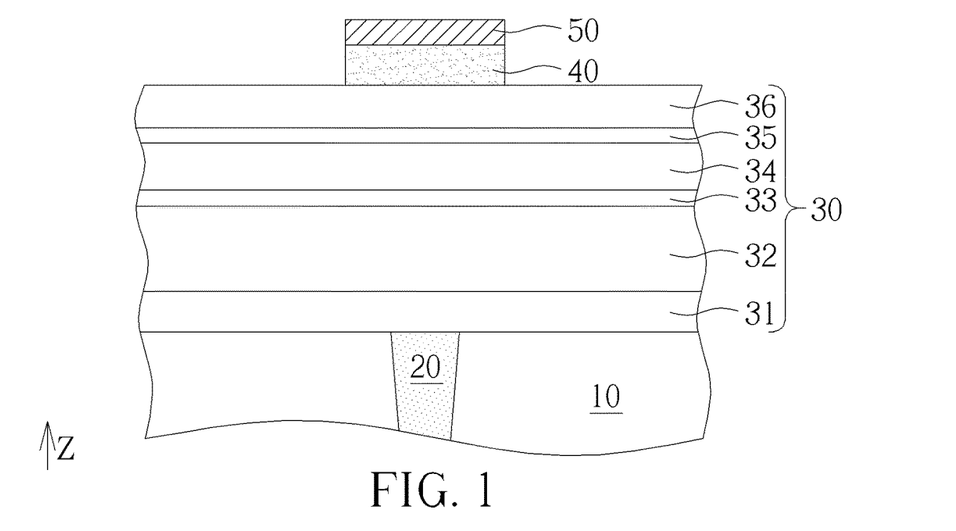

Please refer to FIGS. 1-5. FIGS. 1-5 are schematic drawings illustrating a manufacturing method of a magnetic random access memory (MRAM) cell according to a first embodiment of the present invention. The manufacturing method of the MRAM cell in this embodiment includes the following steps. As shown in FIG. 1, a magnetic tunnel junction (MTJ) film stack 30 is formed on an insulation layer 10. In some embodiments, the MTJ film stack 30 may include a first conductive layer 31, a pinned layer 32, a first barrier layer 33, a free layer 34, a second barrier layer 35, and a second conductive layer 36 sequentially formed on the insulation layer 10 in a thickness direction (such as a perpendicular direction Z shown in FIG. 1), but not limited thereto. The components of the MTJ film stack 30 may be modified and/or include other material layers according to other design considerations. In some embodiments, the first conductive layer 31 and the second conductive layer 36 may include metallic materials, such as tantalum (Ta), platinum (Pt), ruthenium (Ru), a stack layer of the above-mentioned materials, an alloy of the above-mentioned materials, or other suitable conductive materials. The pinned layer 32 may include a synthetic antiferromagnetic layer and a reference layer. The synthetic antiferromagnetic layer may include antiferromagnetic materials such as iron manganese (FeMn) or cobalt/platinum (Co/Pt) multilayer for a perpendicularly magnetized MTJ, but not limited thereto. The free layer 34 and the reference layer in the pinned layer 32 may include ferromagnetic materials such as cobalt, iron (Fe), cobalt-iron (CoFe), cobalt-iron-boron (CoFeB), or other suitable ferromagnetic materials. In addition, the first barrier layer 33 and the second barrier layer 35 may include insulation materials such as magnesium oxide (MgO), aluminum oxide, or other suitable insulation materials. The above-mentioned material layers in the MTJ film stack 30 may be formed by deposition processes, such as sputtering processes, but not limited thereto.

In some embodiments, the insulation layer 10 may include silicon oxide, silicon oxynitride, silicon nitride, or other suitable insulation materials, and the insulation layer 10 may be formed on a substrate (not shown), such as a silicon substrate, a silicon germanium substrate, or a silicon-on-insulator (SOI) substrate, but not limited thereto. Additionally, a first connection structure 20 may be formed in the insulation layer 10 before the step of forming the MTJ film stack 30, and the first connection structure 20 may be electrically connected with the first conductive layer 31 of the MTJ film stack 30, but not limited thereto. In some embodiments, the first connection structure 20 may be formed by filling a recess in the insulation layer 10 with a barrier layer (not shown) and a conductive material (not shown), but not limited thereto. The barrier layer in the first connection structure 20 may include titanium nitride, tantalum nitride, or other suitable barrier materials, and the conductive material in the first connection structure 20 may include materials with relatively lower resistivity, such as copper, aluminum, or tungsten, but not limited thereto. In some embodiments, the first connection structure 20 may be connected downwards to other units or circuits (not shown) in the substrate mentioned above, but not limited thereto. In other words, the first connection structure 20 may be formed by the process of forming an interconnection structure on the substrate.

As shown in FIG. 1, an aluminum mask layer 40 may be formed on the MTJ film stack 30, and a hard mask layer 50 may be formed on the aluminum mask layer 40. In some embodiments, the hard mask layer 50 may include insulation materials such as silicon nitride, silicon oxynitride, or other suitable insulation materials. The hard mask layer 50 and the aluminum mask layer 40 may be formed by the same patterning process or the aluminum mask layer may be formed by a patterning process with the hard mask layer as a mask. Therefore, a projection area of the aluminum mask layer 40 in the perpendicular direction Z may be similar to a projection area of the hard mask layer 50 in the perpendicular direction Z, but not limited thereto.

Figure 2:
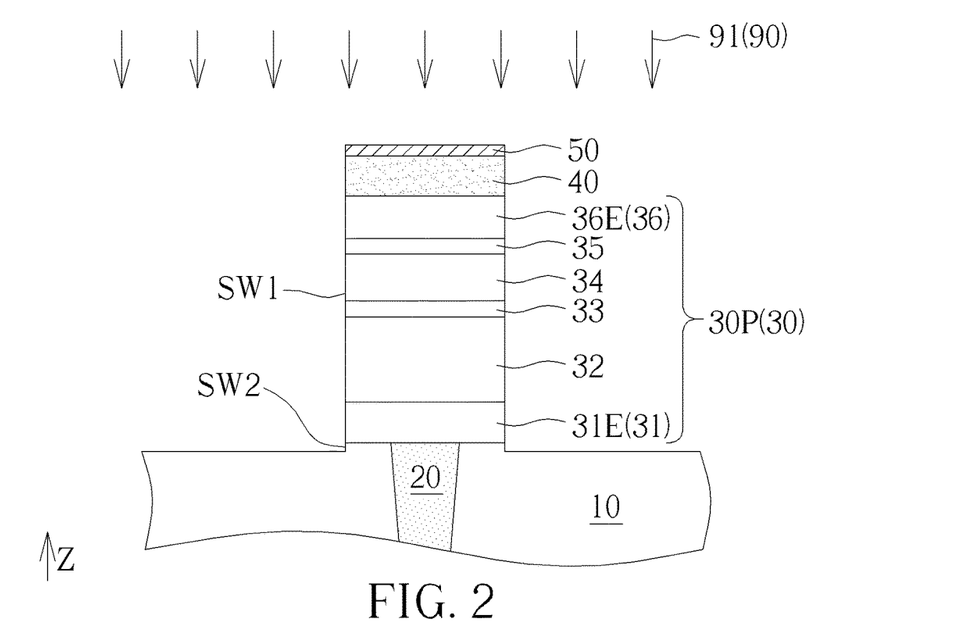
FIG. 2 is a schematic drawing in a step subsequent to FIG. 1.

As shown in FIG. 1 and FIG. 2, an ion beam etching (IBE) process 90 is performed with the aluminum mask layer 40 and the hard mask layer 50 as a mask for etching a part of the MTJ film stack 30 which is not covered by the aluminum mask layer 40 and the hard mask layer 50. The MTJ film stack 30 is patterned to be a patterned MTJ film stack 30P by the IBE process 90. The first conductive layer 31 in the MTJ film stack 30 may be patterned to be a bottom electrode 31E by the IBE process 90, and the second conductive layer 36 in the MTJ film stack 30 may be patterned to be a top electrode 36E by the IBE process 90. Accordingly, the patterned MTJ film stack 30P may include the bottom electrode 31E, the pinned layer 32, the first barrier layer 33, the free layer 34, the second barrier layer 35, and the top electrode 36E. The pinned layer 32 is formed on the bottom electrode 31E. The first barrier layer 33 is formed on the pinned layer 32. The free layer 34 is formed on the first barrier layer 33. The second barrier layer 35 is formed on the free layer 33. The top electrode 36E is formed on the second barrier layer 35. The first connection structure 20 in the insulation layer 10 may be electrically connected with the bottom electrode 31E of the patterned MTJ film stack 30P, and the first connection structure 20 may be formed in the insulation layer 10 before the IBE process 90, but not limited thereto. In some embodiments, a part of the insulation layer 10 may be removed by the IBE process 90, but not limited thereto. Therefore, the insulation layer 10 under the patterned MTJ film stack 30P in the perpendicular direction Z may have a sidewall (such as a second sidewall SW2 shown in FIG. 2) substantially aligned with a sidewall (such as a first sidewall SW1 shown in FIG. 2) of the patterned MTJ film stack 30P, but not limited thereto. In some embodiments, an argon (Ar) bombardment 91 may be used in the IBE process 90 for patterning the MTJ film stack 30. Specifically, the process gas applied in the IBE process 90 may include Ar, oxygen, xenon (Xe), or other suitable gas for etching different kinds of material layers of the MTJ film stack 30, and at least some of the process gas may be used as a bombardment source of the IBE process 90, but not limited thereto.

Figure 3:
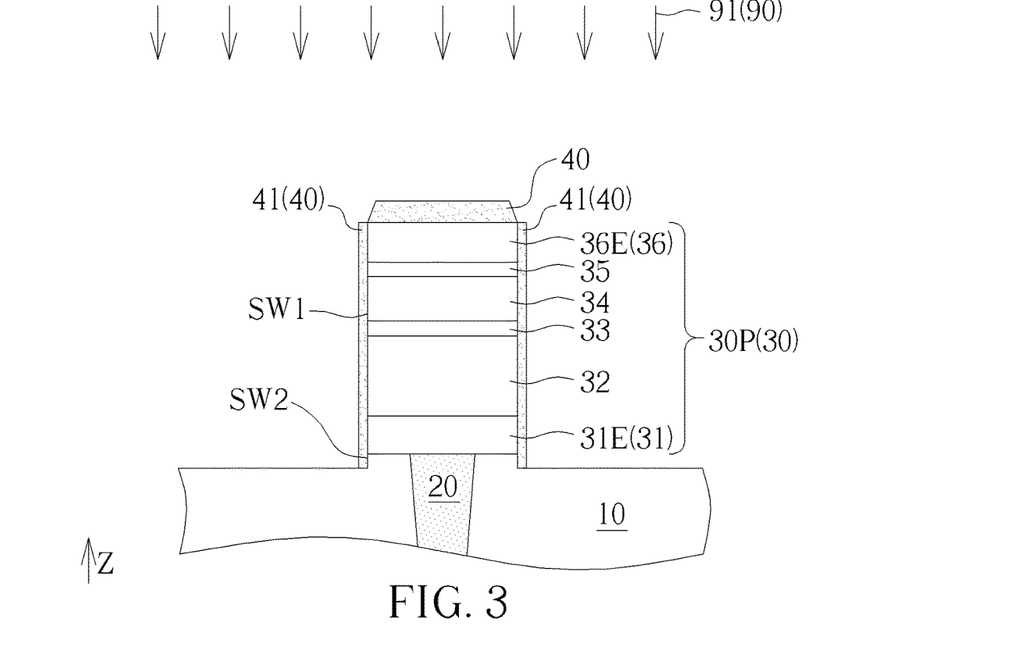
FIG. 3 is a schematic drawing in a step subsequent to FIG. 2.

As shown in FIG. 2 and FIG. 3, at least a part of the aluminum mask layer 40 is bombarded by the IBE process 90 for forming an aluminum film 41 on a sidewall (such as the first sidewall shown in FIG. 3) of the patterned MTJ film stack 30P. In some embodiments, the aluminum film 41 may be a part of the aluminum mask layer 40 bombarded by the Ar bombardment 91 of the IBE process 90 and reflow on the sidewall of the patterned MTJ film stack 30P, and at least a part of the hard mask layer 50 may be removed by the Ar bombardment 91 of the IBE process 90, but not limited thereto. In some embodiments, the aluminum film 41 may also be formed by other kinds of bombardments used in the IBE process 90. In the IBE process 90, the hard mask layer 50 may be used to control the timing of forming the aluminum film 41, and the aluminum film 41 has to be formed after the step of forming the patterned MTJ film stack 30P. Therefore, the thickness of the hard mask layer 50 has to be controlled for covering the aluminum mask layer 40 during the step of forming the patterned MTJ film stack 30P, and at least a part of the aluminum mask layer 40 has to be exposed to the Ar bombardment 91 after the step of forming the patterned MTJ film stack 30P. In some embodiments, a part of the insulation layer 10 may be removed by the Ar bombardment 91 after the step of forming the patterned MTJ film stack 30P and before the step of forming the aluminum film 41, and the aluminum film 41 may be further formed on a sidewall (such as the second sidewall SW2 shown in FIG. 3) of the insulator layer 10 under the patterned MTJ film stack 30P. Therefore, the patterned MTJ film stack 30P may be encompassed by the aluminum film 41 and the aluminum mask layer 40 after the Ar bombardment 91.

Figure 4:
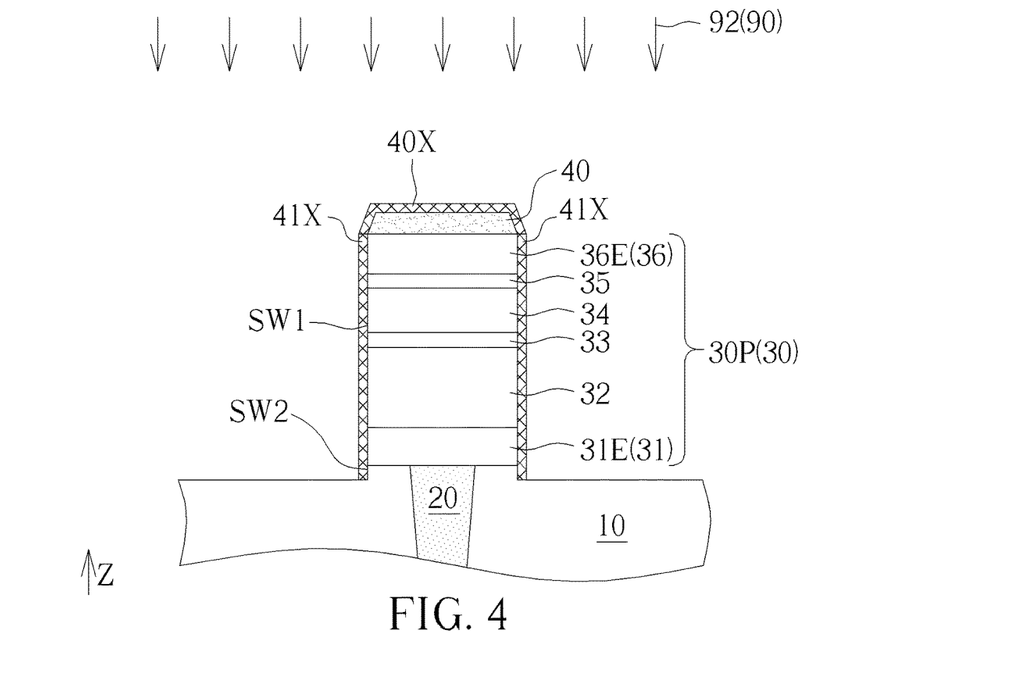
FIG. 4 is a schematic drawing in a step subsequent to FIG. 3.

As shown in FIG. 3 and FIG. 4, an oxidation treatment 92 may be performed after the Ar bombardment 91, and the aluminum film 41 may be oxidized to be an aluminum oxide protection layer 41X on the sidewall (such as the first sidewall shown in FIG. 4) of the patterned MTJ film stack 30P by the oxidation treatment 92. In some embodiments, the oxidation treatment 92 may be a part of the IBE process 90, and the oxidation treatment 92 may be regarded as an in-situ oxidation treatment performed in the same process chamber where the step of patterning the MTJ film stack 30 is performed, but not limited thereto. In some embodiments, the oxidation treatment 92 may be performed after the IBE process 90 and the oxidation treatment 92 may be performed in a process chamber different from that of the IBE process 90. During the oxidation treatment 92, oxygen ion beams may be used to oxidize metal into metal oxide especially when the oxidation treatment 92 is a part of the IBE process 90, but not limited thereto. In some embodiments, other kinds of oxidation approaches may also be applied in the oxidation treatment 92. It is worth noting that, in some embodiments, other metal residues (except aluminum) of the IBE process 90 may also be oxidized by the oxidation treatment 92 to be insulation metal oxide on the sidewall of the patterned MTJ film stack 30P, but not limited thereto. In some embodiments, at least a part of the aluminum mask layer 40 may be oxidized by the oxidation treatment 92, and an aluminum oxide layer 40X may be formed on the surface of the aluminum mask layer 40 by the oxidation treatment 92. The aluminum oxide layer 40X may be connected with the aluminum oxide protection layer 41X formed on the sidewall of the patterned MTJ film stack 30P, and the patterned MTJ film stack 30P may be encompassed by the aluminum oxide protection layer 41X, the aluminum oxide layer 40X, and the aluminum mask layer 40, but not limited thereto.

Figure 5:
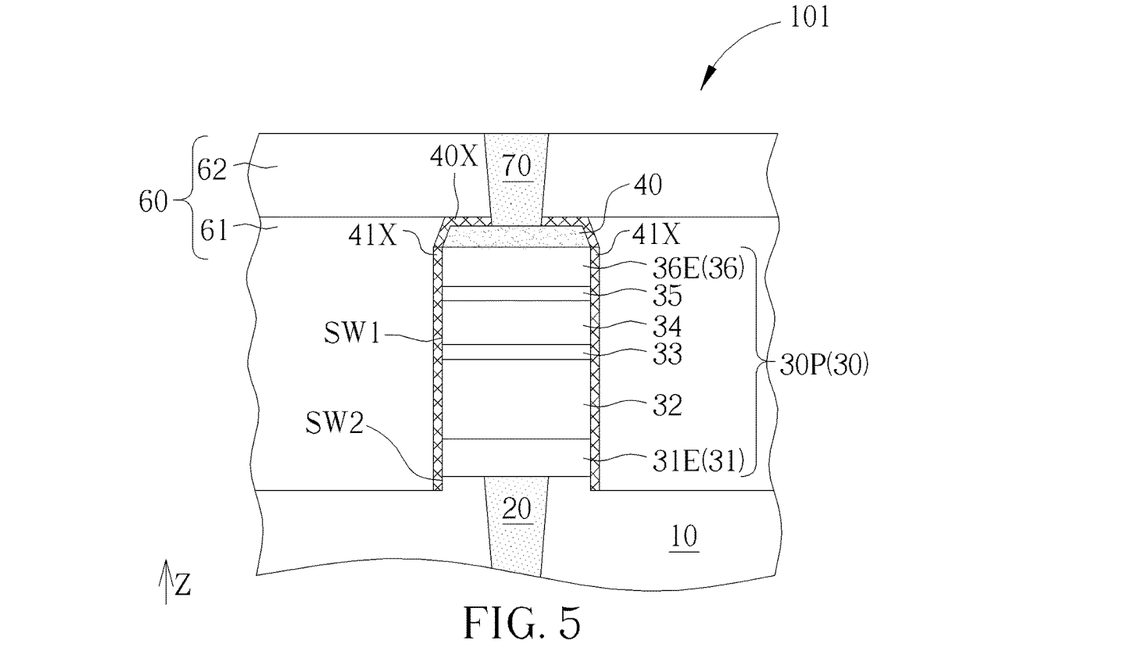
FIG. 5 is a schematic drawing in a step subsequent to FIG. 4.

As shown in FIG. 5, an interlayer dielectric 60 may be formed and cover the aluminum oxide protection layer 41X, the aluminum oxide layer 40X, the aluminum mask layer 40, the insulation layer 10, and the patterned MTJ film stack 30P. The interlayer dielectric 60 may be a single layer or multilayer structure. For example, the interlayer dielectric 60 may include a first dielectric layer 61 and a second dielectric layer 62 formed on the first dielectric layer 61. The first dielectric layer 61 and the second dielectric layer 62 may include dielectric materials such as silicon nitride, silicon oxide, or other suitable dielectric materials. A second connection structure 70 may be formed and penetrate the interlayer dielectric 60 above the patterned MTJ film stack 30P, and the second connection structure 70 may be electrically connected to a topmost portion of the patterned MTJ film stack 30P. In some embodiments, the second connection structure 70 may penetrate the second dielectric layer 62 and the aluminum oxide layer 40X and contact the aluminum mask layer 40 directly, and the second connection structure 70 may be electrically connected to the topmost portion of the patterned MTJ film stack 30P via the aluminum mask layer 40, but not limited thereto. In other words, the second connection structure 70 may be electrically connected to the top electrode 36E of the patterned MTJ film stack 30P via the aluminum mask layer 40, but not limited thereto. In some embodiments, the second connection structure 70 may further penetrate the aluminum mask layer 40 for directly contacting the top electrode 36E of the patterned MTJ film stack 30P. The materials and the manufacturing method of the second connection structure 70 may be similar to those of the first connection structure 20 mentioned above, but not limited thereto. A MRAM cell 101 as shown in FIG. 5 may be formed by the manufacturing steps described above. The aluminum oxide is a non-magnetic insulation material which is great to isolate different layers in the patterned MTJ film stack 30P without influencing the magnetic properties of the patterned MTJ film stack 30P. Therefore, the aluminum oxide protection layer 41X and the aluminum oxide layer 40X may provide a great protection effect to the patterned MTJ film stack 30P without influencing the magnetic properties of the patterned MTJ film stack 30P, and the operation performance and manufacturing yield of the MRAM cell 101 may be enhanced accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 6:
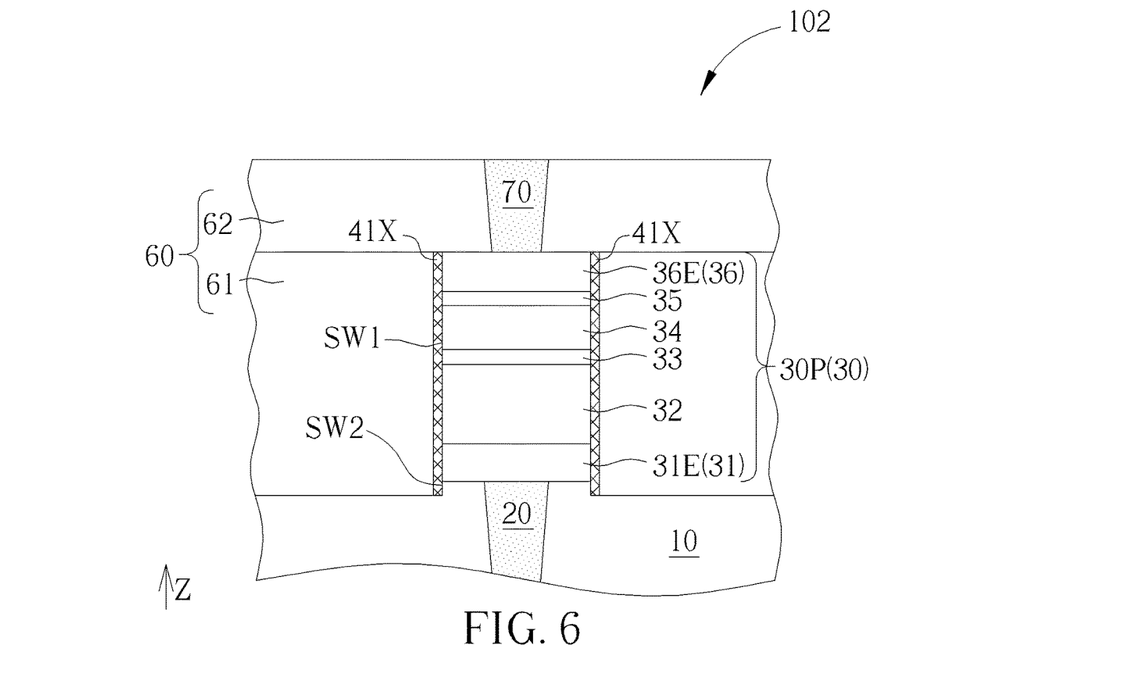
FIG. 6 is a schematic drawing illustrating a manufacturing method of a MRAM cell according to a second embodiment of the present invention.

Please refer to FIG. 6. FIG. 6 is a schematic drawing illustrating a manufacturing method of a MRAM cell 102 according to a second embodiment of the present invention. As shown in FIG. 6, the difference between the manufacturing method of this embodiment and the manufacturing method of the first embodiment is that the aluminum mask layer 40 as shown in FIG. 5 of the first embodiment may be removed before the step of forming the second connection structure 70 in this embodiment. In other words, the MRAM cell 102 does not include the aluminum mask layer 40 mentioned above, and the second connection structure 70 may penetrate the interlayer dielectric 60 above the second connection structure 70 for directly contacting the top electrode 36E. In some embodiments, the aluminum mask layer may be removed before the step of forming the second dielectric layer 62 and after the step of forming the first dielectric layer 61, but not limited thereto.

Figure 7:
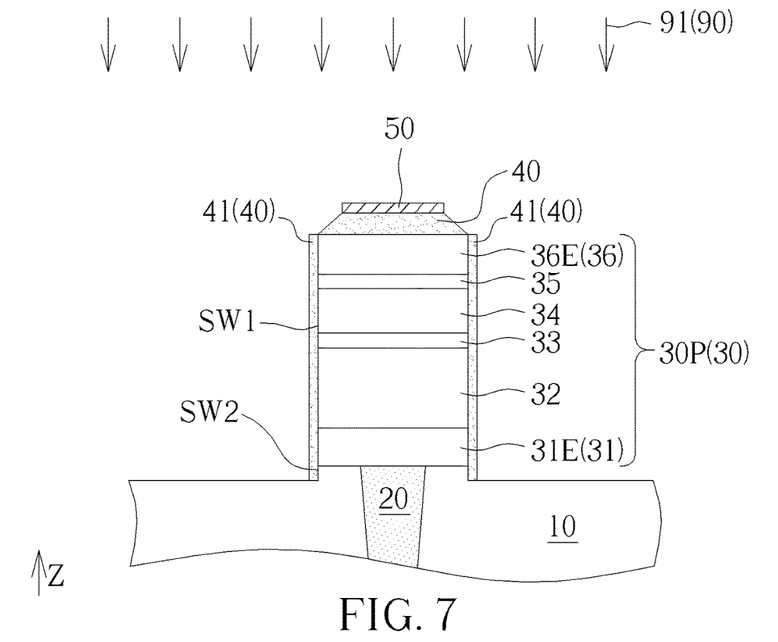
Figure 8:
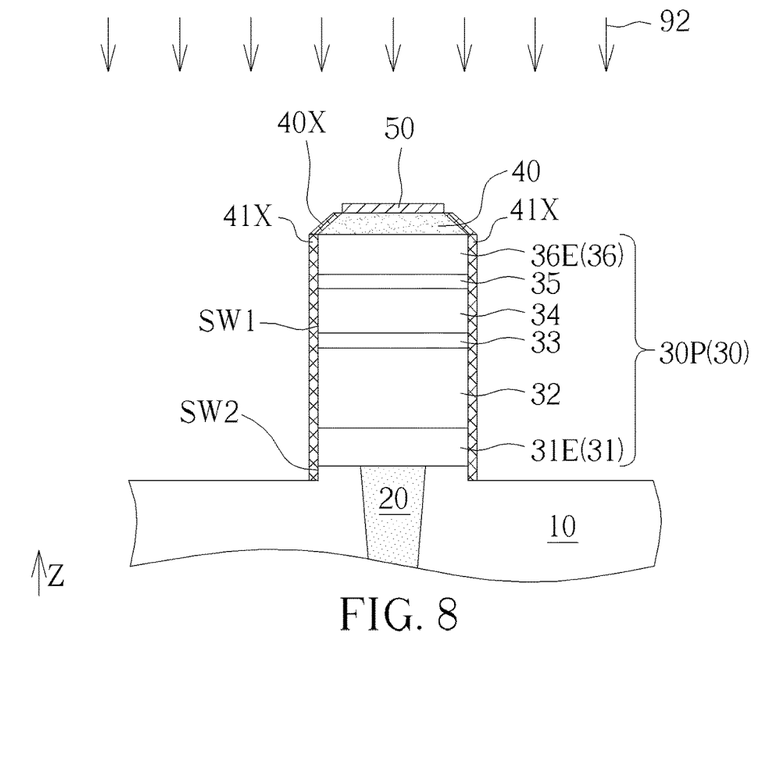
FIG. 8 is a schematic drawing in a step subsequent to FIG. 7.
Figure 9:
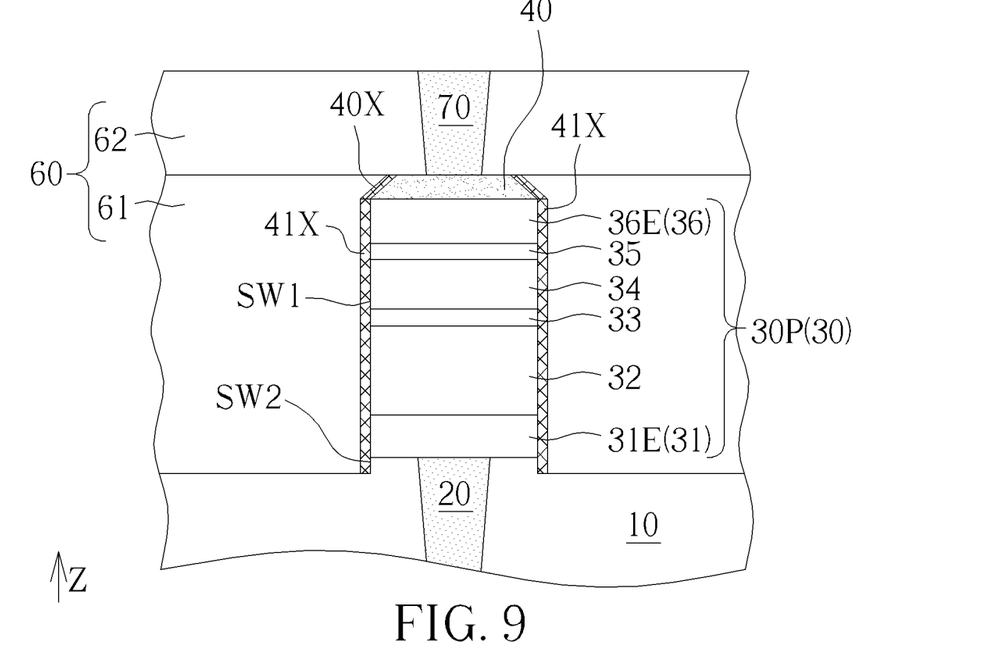
FIG. 9 is a schematic drawing in a step subsequent to FIG. 8.

Please refer to FIGS. 7-9. FIGS. 7-9 are schematic drawings illustrating a manufacturing method of a MRAM cell 103 according to a third embodiment of the present invention. As shown in FIG. 7, a part of the hard mask layer 50 may remain on the aluminum mask layer 40 after the Ar bombardment 91, and a part of the aluminum mask layer 40 is not covered by the aluminum mask layer 40 for being bombarded by the Ar bombardment 91 and forming the Ar bombardment 91 on the first sidewall SW1 of the patterned MTJ film stack 30P and the second sidewall SW2 of the insulation layer 10 under the patterned MTJ film stack 30P. As shown in FIG. 8, a part of the hard mask layer 50 may still remain on the aluminum mask layer 40 during the oxidation treatment 92, and the aluminum oxide layer 40X may be formed on a part of the surface of the aluminum mask layer 40. As shown in FIG. 8 and FIG. 9, the hard mask layer 50 may be removed before the step of forming the second dielectric layer 62, and the second connection structure 70 may penetrate the interlayer dielectric 60 above the second connection structure 70 and directly contact the aluminum mask layer 40.

To summarize the above descriptions, in the manufacturing method of the MRAM cell according to the present invention, the aluminum oxide protection layer is formed on the sidewall of the patterned MTJ film stack by oxidizing the aluminum film formed by bombarding the aluminum mask layer in the IBE process. The aluminum oxide protection layer may provide the protection effect to the patterned MTJ film stack without influencing the magnetic properties of the patterned MTJ film stack. The operation performance and manufacturing yield of the MRAM cell may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a magnetic random access memory (MRAM) cell, comprising:
    forming a magnetic tunnel junction (MTJ) film stack on an insulation layer;
    forming an aluminum mask layer on the MTJ film stack;
    forming a hard mask layer on the aluminum mask layer;
    performing an ion beam etching (IBE) process with the aluminum mask layer and the hard mask layer as a mask, wherein the MTJ film stack is patterned to be a patterned MTJ film stack by the IBE process, and at least a part of the aluminum mask layer is bombarded by the IBE process for forming an aluminum film on a sidewall of the patterned MTJ film stack;
    performing an oxidation treatment, wherein the aluminum film is oxidized to be an aluminum oxide protection layer on the sidewall of the patterned MTJ film stack by the oxidation treatment;
    forming an interlayer dielectric covering the aluminum oxide protection layer and the patterned MTJ film stack; and
    forming a connection structure penetrating the interlayer dielectric above the patterned MTJ film stack, wherein the connection structure is electrically connected to a topmost portion of the patterned MTJ film stack, and the aluminum mask layer is completely removed before the step of forming the connection structure.

2. The manufacturing method of the MRAM cell according to claim 1, wherein an argon (Ar) bombardment is used in the IBE process for patterning the MTJ film stack.

3. The manufacturing method of the MRAM cell according to claim 2, wherein the oxidation treatment is a part of the IBE process, and the oxidation treatment is performed after the Ar bombardment.

4. The manufacturing method of the MRAM cell according to claim 2, wherein at least a part of the hard mask layer is removed by the Ar bombardment.

5. The manufacturing method of the MRAM cell according to claim 1, wherein a part of the insulation layer is removed by the IBE process.

6. The manufacturing method of the MRAM cell according to claim 5, wherein the aluminum film is further formed on a sidewall of the insulator layer under the patterned MTJ film stack.

7. The manufacturing method of the MRAM cell according to claim 1, wherein the patterned MTJ film stack comprises:
    a bottom electrode;
    a pinned layer formed on the bottom electrode;
    a first barrier layer formed on the pinned layer;
    a free layer formed on the first barrier layer;
    a second barrier layer formed on the free layer; and
    a top electrode formed on the second barrier layer.

8. The manufacturing method of the MRAM cell according to claim 7, further comprising:
    forming a first connection structure in the insulation layer before the IBE process, wherein the first connection structure is electrically connected with the bottom electrode.

9. The manufacturing method of the MRAM cell according to claim 1, wherein a part of the hard mask layer remains on the aluminum mask layer during the oxidation treatment.

10. The manufacturing method of the MRAM cell according to claim 1, wherein at least a part of the aluminum mask layer is oxidized by the oxidation treatment.

* * * * *